United States Patent
Meyer et al.

(10) Patent No.: US 10,821,704 B2
(45) Date of Patent: Nov. 3, 2020

(54) SUBSTRATE FOR ELECTRICAL CIRCUITS AND METHOD FOR PRODUCING A SUBSTRATE OF THIS TYPE

(71) Applicant: Rogers Germany GmbH, Eschenbach (DE)

(72) Inventors: Andreas Meyer, Wenzenbach (DE); Karsten Schmidt, Eschenbach (DE)

(73) Assignee: ROGERS GERMANY GMBH, Eschenbach (DE)

( * ) Notice: Subject to any disclaimer, the term of this patent is extended or adjusted under 35 U.S.C. 154(b) by 45 days.

(21) Appl. No.: 15/744,363

(22) PCT Filed: Jul. 18, 2016

(86) PCT No.: PCT/EP2016/067069
§ 371 (c)(1),
(2) Date: Jan. 12, 2018

(87) PCT Pub. No.: WO2017/013073
PCT Pub. Date: Jan. 26, 2017

(65) Prior Publication Data
US 2018/0200990 A1    Jul. 19, 2018

(30) Foreign Application Priority Data
Jul. 17, 2015  (DE) .......................... 10 2015 111 667

(51) Int. Cl.
*B32B 15/20* (2006.01)
*B32B 9/00* (2006.01)
(Continued)

(52) U.S. Cl.
CPC ............... *B32B 9/005* (2013.01); *B32B 5/12* (2013.01); *B32B 5/20* (2013.01); *B32B 7/12* (2013.01);
(Continued)

(58) Field of Classification Search
None
See application file for complete search history.

(56) References Cited

U.S. PATENT DOCUMENTS

| 4,810,563 A | * | 3/1989 | DeGree | ................... B32B 15/08 428/209 |
| 7,361,568 B2 | * | 4/2008 | Dunn | .................. H01G 9/0032 257/532 |

(Continued)

FOREIGN PATENT DOCUMENTS

| EP | 0525644 A1 | 2/1993 |
| GB | 2125618 A | 3/1984 |
| WO | 2015061649 A1 | 4/2015 |

OTHER PUBLICATIONS

International Search Report for International Application No. PCT/EP2016/067069, dated Jul 18, 2016, 12 pages (German).

*Primary Examiner* — Seth Dumbris
(74) *Attorney, Agent, or Firm* — Cantor Colburn LLP

(57) ABSTRACT

The invention relates to a substrate (1) for electrical circuits comprising at least one first composite layer (2) which is produced by means of roll cladding and, after said roll cladding, has at least one copper layer (3) and an aluminium layer (4) attached thereon, wherein at least the surface side of the aluminium layer (4) facing away from the copper layer (3) is anodized for the generation of an anodic or insulating layer (5) made of aluminium oxide, and wherein the anodic or insulating layer (5) made of aluminium oxide is connected to a metal layer (7) or at least one second composite layer (2') or at least one paper-ceramic layer (11) via at least one adhesive layer (6, 6').

14 Claims, 8 Drawing Sheets

(51) Int. Cl.

| | |
|---|---|
| *B32B 5/12* | (2006.01) |
| *B32B 5/20* | (2006.01) |
| *B32B 7/12* | (2006.01) |
| *B32B 9/04* | (2006.01) |
| *B32B 9/06* | (2006.01) |
| *B32B 29/08* | (2006.01) |
| *H01L 23/373* | (2006.01) |
| *H05K 1/05* | (2006.01) |
| *B32B 15/04* | (2006.01) |
| *B32B 15/12* | (2006.01) |
| *B32B 29/00* | (2006.01) |
| *C25D 11/04* | (2006.01) |
| *C25D 17/12* | (2006.01) |
| *C25D 11/00* | (2006.01) |
| *H05K 1/02* | (2006.01) |
| *H05K 1/03* | (2006.01) |
| *H05K 3/46* | (2006.01) |
| *C25D 11/08* | (2006.01) |

(52) U.S. Cl.
CPC ............... *B32B 9/041* (2013.01); *B32B 9/06* (2013.01); *B32B 15/043* (2013.01); *B32B 15/12* (2013.01); *B32B 15/20* (2013.01); *B32B 29/002* (2013.01); *B32B 29/08* (2013.01); *C25D 11/005* (2013.01); *C25D 11/04* (2013.01); *C25D 17/12* (2013.01); *H01L 23/3735* (2013.01); *H05K 1/0201* (2013.01); *H05K 1/0313* (2013.01); *H05K 1/053* (2013.01); *H05K 3/4688* (2013.01); *B32B 2255/06* (2013.01); *B32B 2255/205* (2013.01); *B32B 2255/26* (2013.01); *B32B 2255/28* (2013.01); *B32B 2264/107* (2013.01); *B32B 2307/202* (2013.01); *B32B 2307/206* (2013.01); *B32B 2307/54* (2013.01); *B32B 2457/08* (2013.01); *B32B 2605/00* (2013.01); *C25D 11/08* (2013.01); *H05K 2201/0116* (2013.01); *H05K 2201/0338* (2013.01); *H05K 2203/0315* (2013.01); *H05K 2203/11* (2013.01); *H05K 2203/1126* (2013.01)

(56) References Cited

U.S. PATENT DOCUMENTS

| | | | |
|---|---|---|---|
| 2004/0053020 A1* | 3/2004 | Mashiko | C25D 11/04 428/209 |
| 2007/0139864 A1* | 6/2007 | Dunn | H01G 9/0032 361/523 |
| 2012/0103588 A1* | 5/2012 | Kim | H05K 1/053 165/185 |

* cited by examiner

SUBSTRATE FOR ELECTRICAL CIRCUITS AND METHOD FOR PRODUCING A SUBSTRATE OF THIS TYPE

CROSS-REFERENCE TO RELATED APPLICATIONS

This application is a National Stage filing of PCT/EP2016/067069, filed 18 Jul. 2016, which claims priority to DE 10 2015111667.7, filed 17 Jul. 2015.

BACKGROUND

The invention relates to a substrate for electrical circuits as well as a method for producing a substrate of this type.

Substrates for electrical circuits in the form of circuit boards are well known in the art.

To this effect, such substrates are multilayer substrates, comprising at least one insulating layer and at least one metal layer or metallization connected to such insulating layer. The metal layer or the metallization is planarly joined to the insulating layer, either directly or, optionally, via additional metal or insulating layers and is structured into several metallization surface portions in order to form printed circuits, contacts, contact and/or connection surfaces.

In particular, in the field of the use of such substrates in power electronics, i.e. so-called "low voltage" applications, such as for the construction of power semiconductor modules in a voltage range of less than 2.5 k, it is necessary that the substrates or their insulating layer, respectively, have a high insulating strength, i.e. voltage and disruptive strength.

Therefore, metal ceramic substrates are often used in the field of power electronics, the insulating layer of which is formed of at least one ceramic layer having a high insulating strength. For example, the ceramic layer is made of oxide, nitride, or carbide ceramic, such as aluminium oxide ($Al_2O_3$) or aluminium nitride (AlN) or silicium nitride ($Si_3N_4$) or silicium carbide (SiC) or of aluminium oxide with zirconium oxide ($Al_2O_3+ZrO_2$).

In order to flatly join the ceramic layer to at least one metal layer forming a metallization, distinct manufacture methods known in the art are used, depending on the ceramic material used and/or the metal of the metal layer to be bonded, namely for example a "direct-copper-bonding" method, a "direct-aluminium-bonding" method and an "active-metal-bonding" method. The disadvantages of such manufacture methods are the complex and costly technical processes. Shaping is also restricted when using conventional ceramic layers.

Moreover, methods for producing highly charged papers are known in the art and where the paper structure is enriched by up to 85% by weight with functional filler material, e. g. with sinterable ceramic powered, highly adsorptive powder or powder offering good heat conductivity, during the paper production process. A so-called sinter paper respectively a paper ceramic is produced from the pre-ceramic paper enriched with a sinterable ceramic powder, for example aluminium powder, optionally, following an additional shaping process by thermal implementation, among others by a two-step thermal implementation. In the context of the first step of the thermal implementation, the organic components of the pre-ceramic papers, such as pulp, starch and latex, are removed by oxidation, whereby a so-called "brown compact" is generated. Subsequently, the "brown compact" is sintered in a second step of the thermal implementation, thereby generating a ceramic substance having the typical bending strength of ceramic. Among others, the microstructure of said sinter paper respectively the paper ceramic among others shows the material properties typical for ceramics, for example also a high insulating strength. Such paper ceramics enable combining the advantages of ceramic materials with the paper-related technical advantages, such as simple shaping and low weight.

SUMMARY

Based upon the aforementioned state of the art, the object of the invention is to illustrate a substrate for electrical circuits as well as an associated method for producing such a substrate which, compared to the manufacture method of such a substrate known in the art, is simple and cost-efficient. The object is achieved by a substrate according to Claim 1 and a method according to Claim 15.

The essential aspect of the substrate of the invention for electrical circuits is the fact that at least one first composite layer produced by roll cladding is provided which, following such roll cladding, comprises at least a copper layer and an aluminium layer adjoining to it. At least the surface side of the aluminium layer facing away from the copper layer is anodized to generate an anodic respectively insulating layer made of aluminium oxide and the anodic respectively the insulating layer made of aluminium oxide is connected with a metal layer via at least an adhesive layer or at least to a second composite layer or a paper ceramic layer. The roll cladded composite layer is quickly, simply and cost-efficiently producible and advantageously produced as roll or plate ware and can be processed during the subsequent processes. The required insulating strength of the substrate is achieved by generating an insulating layer made of aluminium oxide by appropriate oxidation of the aluminium layer, the layer thickness of which can be ensured depending on the required insulating properties. Thereby, the metal layer can take over a cooling function and have an appropriate material thickness and/or surface enlargement. When using a second composite layer, which preferably is structured by analogy to the first composite layer, the insulating strength, in particular the voltage and disruptive strength, can be enhanced still further. Alternatively, the use of a paper ceramic layer can also improve the insulating strength.

Advantageously, the second composite layer also comprises an anodic respectively an insulating layer and the anodic respectively the insulating layers of the first and the second composite layers are connected via the at least one adhesive layer, i.e. there is a direct connection between both composite layers via at least one adhesive layer.

Alternatively, the first and the second composite layer are connected via at least one additional intermediate layer by means of one adhesive layer each. In an alternative embodiment, the intermediate layer is formed by an aluminium layer, which, for the purpose of generating two opposite anodic respectively insulating layers made of aluminium oxide, is anodized on its opposing surface sides.

Alternatively, the intermediate layer can be formed by a third composite layer comprising an aluminium layer, a copper layer, and an additional aluminium layer, wherein the respective surface sides of the aluminium layers facing away from the copper layer are anodized in order to generate two opposite anodic respectively insulating layers made of aluminium oxide.

The anodic or the insulating layers, respectively, made of aluminium oxide of the first composite layer are connected via an adhesive layer to the one anodic respectively insulating layers made of aluminium oxide of the respective intermediate layer and the anodic respectively the insulating layers made of aluminium oxide of the second composite layer are connected via an additional adhesive layer to the other anodic respectively insulating layers made of aluminium oxide of the intermediate layer. The described structure of the intermediate layers enables achieving an enhanced heat distribution and dissipation as well as an enhanced insulating strength.

In one alternative embodiment, only a fraction of the layer thickness of the respective aluminium layer is anodized respectively the layer thickness of the insulating layer produced by the at least partially transformed aluminium layer ranges between 5 µm and 50 µm.

Alternatively, at least one aluminium layer of the substrate can be completely anodized and thereby, the aluminium layer can be entirely transformed into the anodic respectively the insulating layer made of aluminium oxide. A complete transformation of an anodic layer is advantageous in particular with aluminium layers of low layer thicknesses as any contamination of the etching bath for introducing structures into the copper layer, owing to the aluminium layers, can be avoided.

Advantageously, the copper layer comprises a layer thickness ranging from 35 µm to 2 mm, the aluminium layer comprises a layer thickness ranging between 10 µm and 300 µm and the metal layer comprises a layer thickness ranging between 300 µm and 50 mm.

In one alternative embodiment of the invention, at least one aluminium layer comprises a profiling introduced prior to the realisation of the anodic process and which comprises for example a plurality of pyramid or prism form recesses.

Hence, the surface of the anodic respectively the insulating layer generated at a later stage is enlarged, thereby enhancing both the adhesive strength of the adhesive connection as well as the thermal conductivity of the substrate. When directly connecting two compound layers via an adhesive layer, the profiling of the respective aluminium layers are adjusted to each other, i.e. such that they are interlocked.

Advantageously, one uses an adhesive layer which is made of an epoxy resin adhesive, acrylic adhesive, or polyurethane adhesive. In an advantageous alternative embodiment, the adhesive used to produce the adhesive layer has a low viscosity in order to be able to penetrate into and to fill potential cracks in the surface of the insulating layers. Thereby, any inclusion in the substrate, in particular in the connection area, which might entail degradation of the insulating strength, are avoided.

At least one of the copper layers is advantageously structured into several metallization portions in order to form circuit boards, contact and/or connecting surfaces. Preferably, the copper layer of the composite layer is structured and forms the layout side of the substrate. With an appropriate thickness of the substrate, in particular the use of two composite layers and, optionally, an additional intermediate layer, even structuring of both metallization of the substrates may be realized.

Another object of the invention is a method for producing a substrate for electrical circuits, wherein at least one first composite layer is produced from a copper foil and at least one aluminium foil by means of roll cladding, comprising at least one copper layer and one adjoining aluminium layer wherein at least the surface side of the aluminium layer facing away from the copper layer is anodized and thereby generating an anodic respectively insulating layer made of aluminium oxide and wherein the generated anodic respectively insulating layer made of aluminium oxide is adhered via at least one adhesive layer with a metal layer or at least a second composite layer.

Further developments, advantages, and application options of the invention also result from the following description of the exemplary embodiments and from the figures, wherein any and all characteristics described and/or illustrated are basically an object of the invention, alone or in any combination, irrespective of their summary made in the claims or any reference made thereto. Herein, the content of the claims also becomes part of the description.

DESCRIPTION OF THE FIGURES

Hereinafter, the invention will be explained in more detail based on the figures and by means of exemplary embodiments, wherein.

DETAILED DESCRIPTION

Figure 1:
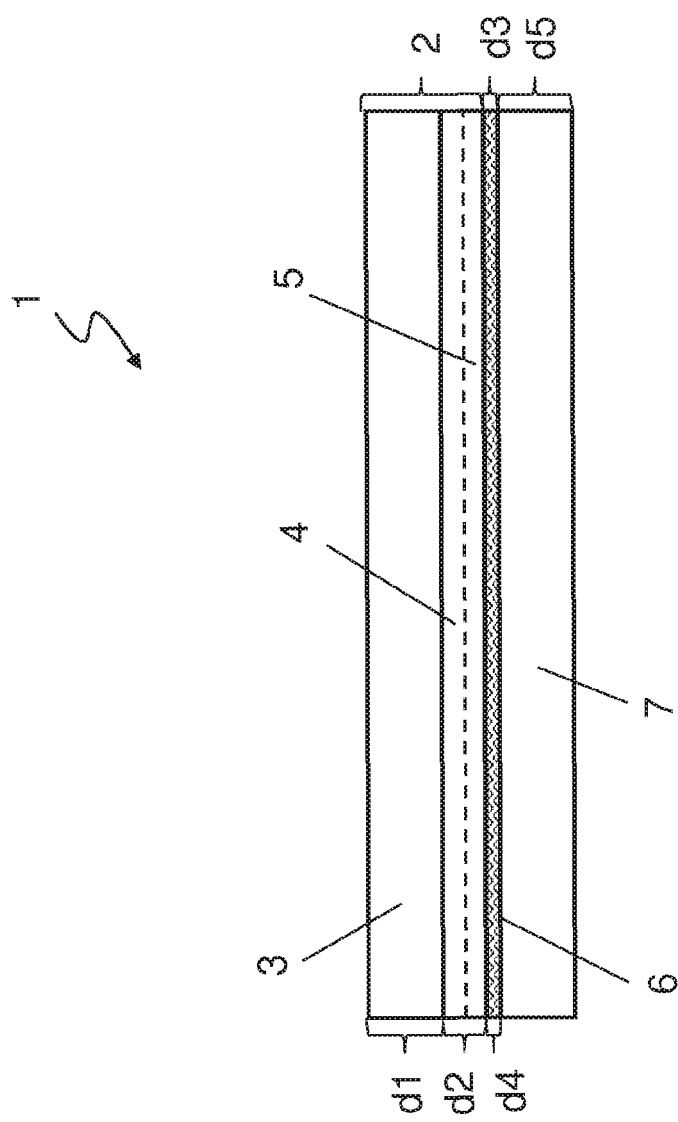
FIG. 1 shows a simplified, schematic sectional representation of a substrate according to the invention, comprising a first composite layer and a metal layer.

FIG. 1 shows a simplified, schematic representation of a substrate through a substrate 1 formed according to the invention for electrical circuits and which comprises a platform and multilayer structure, i.e. which is formed in the shape of a circuit board.

In a first alternative embodiment, the substrate 1 according to the invention is composed of at least one first composite layer 2, which is produced by roll cladding of a copper foil with at least one aluminium foil. Consequently, the first composite layer 2 comprises a copper layer 3 and an aluminium layer 4 adjoining to it.

The aluminium layer 4 is anodized to generate an insulating layer 5 made of aluminium oxide, namely the insulating layer 5 made of the aluminium oxide or the anodic layer, extends from the surface side of the aluminium layer 4 facing away from the copper layer 3 over at least a fraction of the aluminium layer 4, i.e. a fraction of the aluminium layer 4 of the first composite layer 2, undergoes an anodic process known in the art, namely an anodic oxidation and is thereby transformed into an insulating layer 5 made of aluminium oxide or an anodic layer, respectively. The insulating layer 5 made of aluminium oxide comprises a high voltage and disruptive strength and a thermal conductivity ranging between 8 W/mK and 30 W/mK.

The insulating layer 5 of the substrate 1 according to the invention is connected or adhered, respectively, via an adhesive layer 6, for example to a metal layer 7. Preferably, the adhesive layer 6 extends completely over the surface of the insulating layer 5. The metal layer 7, for example, can be formed by an additional aluminium layer or an aluminium plate for cooling purposes. In a preferred alternative embodiment, the metal layer 7 can form a cooling body and comprise a profiling on the surface side opposite to the adhesive layer to increase the surface wherein such profiling can have the most various designs, in particular with respect to the shape, arrangement and depth of existing recesses.

Various adhesives appropriate for gluing aluminium oxide, such as epoxy resin adhesives, acrylic adhesives, or polyurethane adhesives, can be used to generate the adhesive layer 6. Preferably, one uses low adhesives respectively low viscosity adhesive substances in order to fill the porous surface of the generated anodic layer respectively the insulating layer 5 made of aluminium oxide, thereby further enhancing the insulating strength of the substrate 1.

Within the first composite layer 1, the copper layer 3 comprises a layer thickness d1 ranging between 35 μm and 2 mm and the aluminium layer 4 comprises a layer thickness d2 ranging between 10 μm and 300 μm, wherein the layer thickness d3 of the insulating layer 5 produced from the at least partially transformed aluminium layer 4 ranges from 5 μm to 50 μm. In one alternative embodiment of the invention, the aluminium layer 4 can also be completely anodized, i.e. the completely anodized aluminium layer 4 forms the insulating layer 5. Preferably, the adhesive layer 6 has a layer thickness d4 ranging between 1 μm and 20 μm. The layer thickness d5 of the metal layer 7 ranges from 300 μm to 50 mm.

The substrate 1 serves as circuit boards for electrical and electronic circuits or circuit modules, in particular for electronic power circuits. To this effect, at least the copper layer 3 of the first composite layer 1 is structured into several metallization portions which form circuit boards, contact and/or contact surfaces, for example, by means of masking and etching technologies known in the art as such. Preferably, said structuring of the copper layer 3 of the first composite layer 1 is realized after the production of the substrate 1. Due to the very thin anodic layer respectively insulating layer 5, preferably, only one of the metallizations of the substrate 1, namely the copper layer 3 of the first composite layer 2, is structured, in order to ensure sufficient stability of the substrate 1. But with an appropriate, stability enhancing intermediate layer, even the structuring of both metallizations of the substrate 1 respectively the metal layer 7 is possible. Structuring of the copper layer 3 of the first composite layer 2 is preferably realized up to the anodic layer respectively the insulating layer 5 of the aluminium oxide.

Figure 2:
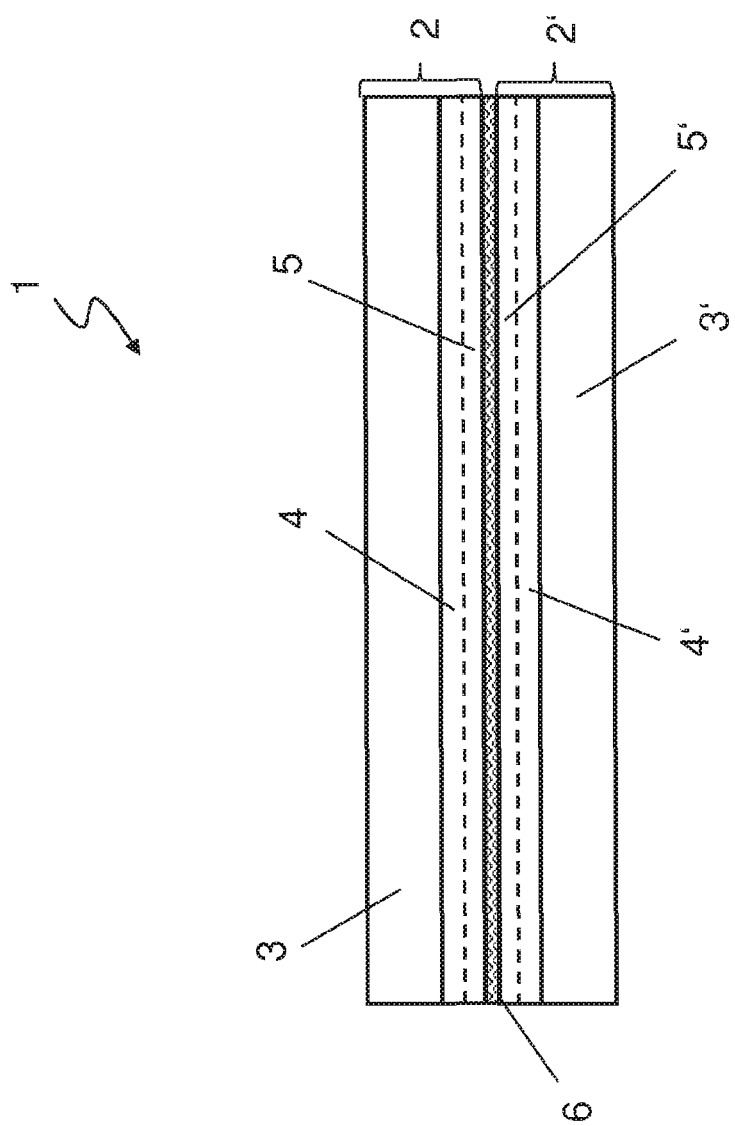
FIG. 2 shows a simplified sectional representation by way of an alternative embodiment of a substrate according to the invention, comprising a first and a second composite layer.

FIG. 2 shows an alternative embodiment of the substrate 1 according to FIG. 1 where, instead of the metal layer 7, a second composite layer 2' is connected to the first composite layer 2 via the adhesive layer 6. In the illustrated alternative embodiment, the first and the second composite layer 2, 2' show a similar, preferably identical structure, i.e. the second composite layer 2' also comprises a copper layer 3', an aluminium layer 4' adjoining to it which is at least partially transformed into an insulating layer 5' respectively an anodic layer made of aluminium oxide by means of anodization on its surface side opposite to the copper layer 3'. The insulating layers 5, 5' opposite to each other in a composite form are for example directly connected to each other via the adhesive layer 6. The provision of two insulating layers 5, 5' further enhances the insulating strength of the substrate 1.

In a first step during manufacture, the first and the second composite layers 2, 2' are produced, preferably from the same roll cladded composite substance layer, and then, an adhesive layer 6 is applied onto at least one of the insulating layers 5, 5', preferably both insulating layers 5, 5' are applied, the composite layers 2, 2' thereby prepared are subsequently combined and adhered or laminated with each other, respectively. Subsequently, the adhesive respectively the adhesive substance of the adhesive layer 6 is then cured, for example by appropriate application of pressure and/or temperature.

Subsequently, at least one of the copper layers 3, 3' is structured by means of masking and etching technologies known in the art in order to form several metallization portions. Following final cleaning of the substrate 1 already structured, an edge sealing can be realized, but this is not essential.

Production of the substrate 1 according to the invention in the form of multi-substrates, which are separated after manufacture in order to form the desired "single" substrates 1, is also possible. For the substrates 1 of the invention, said separation is realized for example by means of mechanical processing processes such as for example sawing, cutting or punching or by using a laser unit. According to this and by contrast to the state of the art, the unstructured metal layer 7 preferably also extends up to the border of the cutting edge of the respective substrate 1.

Figure 3:
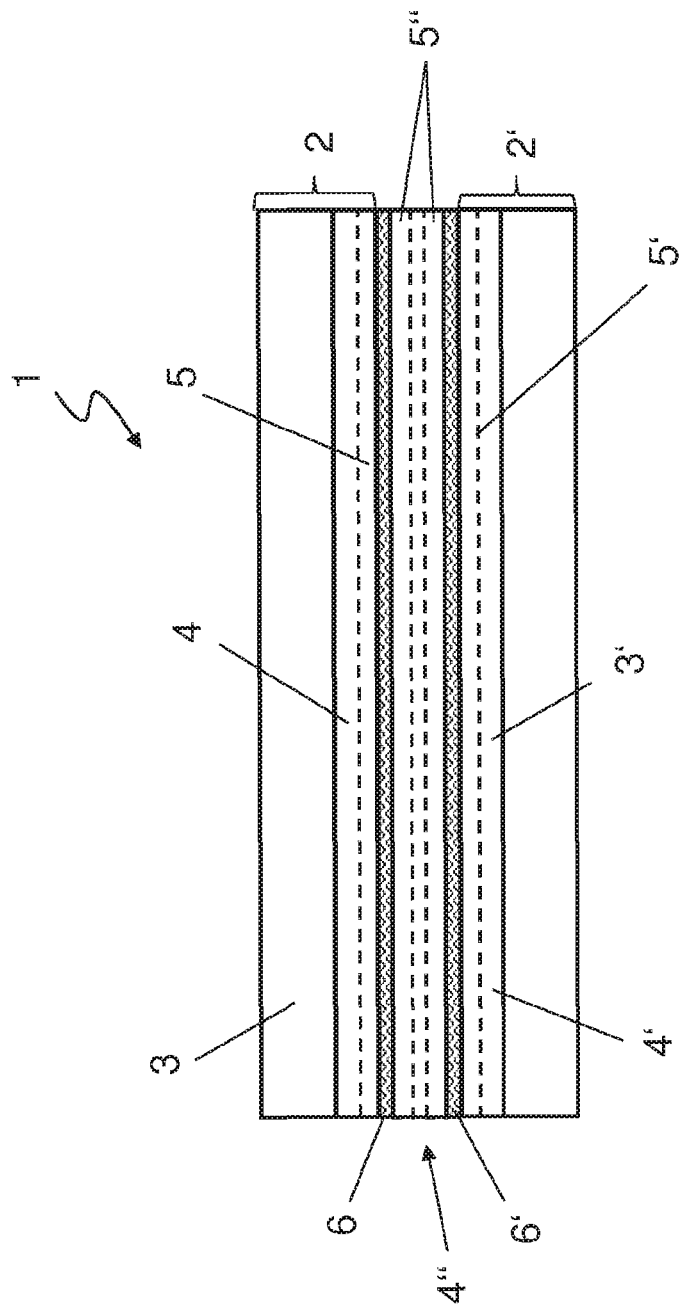
FIG. 3 shows a simplified sectional representation of an additional alternative embodiment of a substrate according to the invention, comprising a first and a second composite layer having an intermediate layer.

FIG. 3 shows an additional alternative embodiment of the substrate 1 according to the invention where, in order to further enhance the voltage and disruptive strength between the first and the second composite layers 2, 2' according to the alternative embodiment of FIG. 2, an additional aluminium layer 4'' is arranged, the top and bottom side of which are anodized to generate an insulating layer 5'' each made of aluminium oxide. Alternatively, it is also possible to provide only one insulating layer 5'' made of aluminium oxide, i.e. the additional aluminium layer 4'' is completely anodized. The insulating layer respectively the insulating layers 5'' are connected to the insulating layers 5, 5' of the first and the second composite layer 2, 2' via one adhesive layer 6, 6' each.

Figure 4:
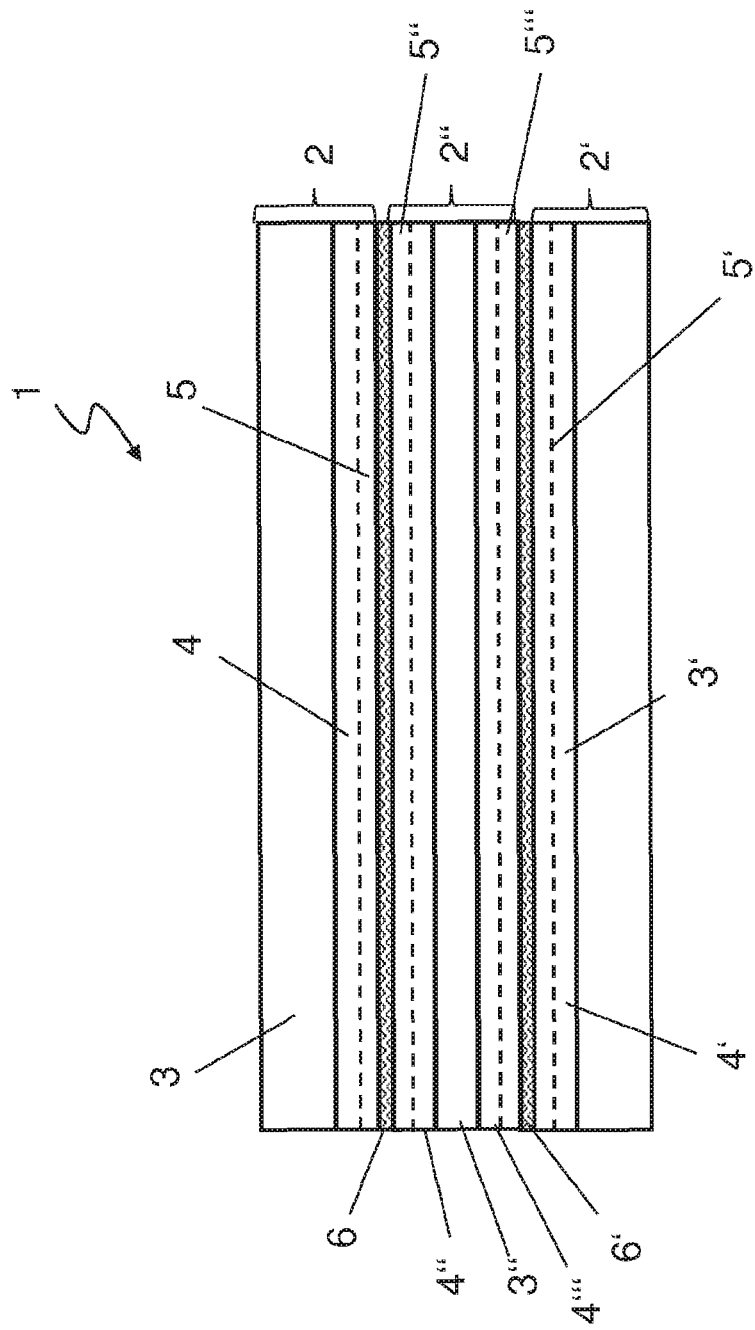
FIG. 4 shows a simplified sectional representation of another alternative embodiment of a substrate according to the invention, comprising a first to third composite layer.

Another alternative embodiment according to FIG. 4 comprises a third composite layer 2''' arranged between the first and the second composite layer 2, 2' of the substrate 1 of FIG. 2 and composed of a medium copper layer 3'', the top and bottom sides of which are equipped with an aluminium layer 4'', 4''', wherein the respective aluminium layer 4'', 4''' comprises one insulating layer 5'' each, in analogy to the aforementioned exemplary embodiments. The connection of the insulating layers 5, 5', 5'' of the first to third composite layer 2, 2', 2'', again, is realized via one respective adhesive layer 6, 6'. Advantageously, the copper layer 3'' can also be used electrically and be structured in several metallization portions, for example. It is clear that even several medium copper layers 3'' can be provided.

Figure 5:
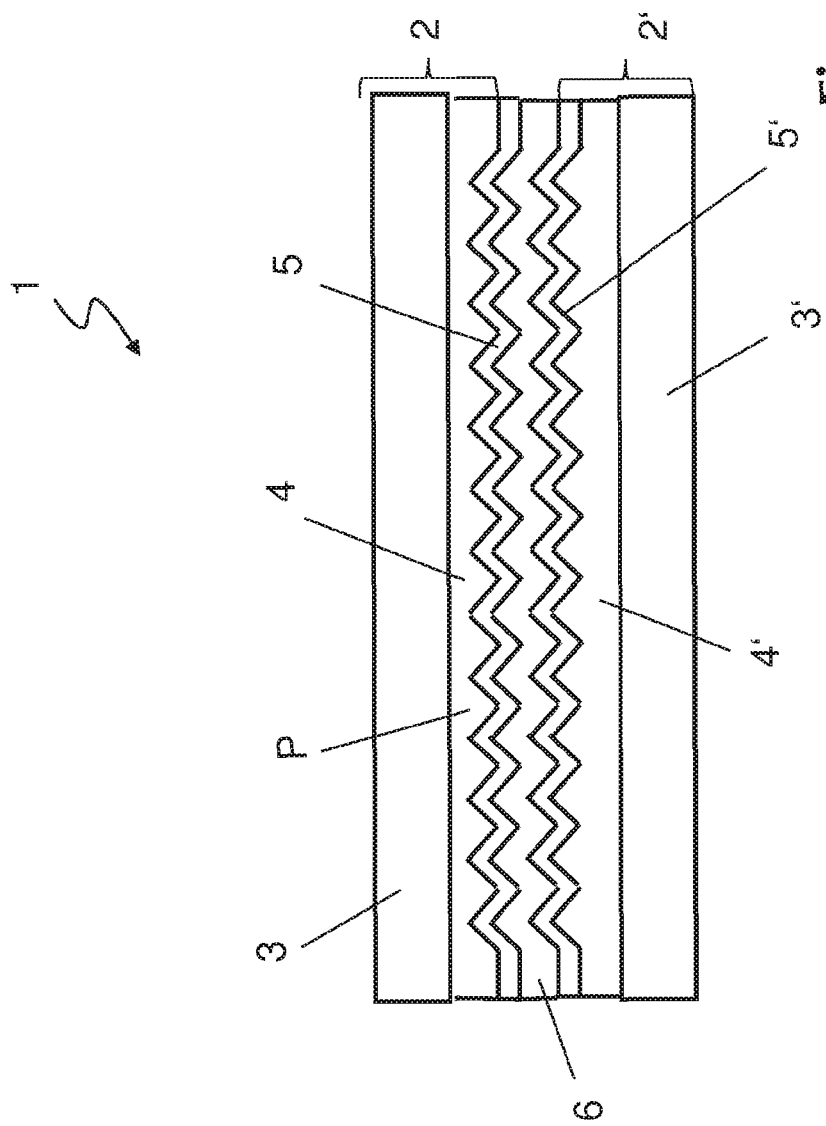
FIG. 5 shows a simplified sectional representation of an additional alternative embodiment of a substrate according to the invention, comprising a first and a second composite layer each having a profiled intermediate layer.

In order to enhance the thermal transfer properties of the substrate 1, a profiling, for example in the form of pyramid or prism shaped recesses, is introduced into the respective aluminium layer 4, 4' in an alternative embodiment of FIG. 5, prior to realizing the anodic process. An introduction of profiling into the respective aluminium layer 4, 4' can for example be realized by embossing via rolling or via cutting out. Thereby, the thermal resistance of the substrate 1 is reducible once again. Preferably, an aluminium layer 4, 4' having an increased layer thickness d2 between 0.1 mm and 1 mm is used herein.

In an alternative embodiment, not shown herein, the copper layer 3, 3' having bigger layer thicknesses d1 of the first and/or the second composite layer 2, 2' of FIGS. 2 and 5 can also already be pre-structured prior to production of the adhesive connection 6, namely in particular after anodization of the aluminium layer 4, 4', preferably by punching, laser cutting or water jet cutting, i.e. without using a complex and costly masking and etching technology. This enables reducing the insulating gap width between the structured copper portions.

In the method according to the invention for producing such substrates 1, the composite layers 2, 2', 2" are produced by roll cladding of a copper foil with an aluminium foil, respectively an aluminium foil, a copper foil, and an additional aluminium foil, namely preferably in the form of a band. It is clear, however, that the described composite layers 2, 2', 2" can be manufactured as plate ware. Thereby, the composite layers 2, 2', 2" which are roll cladded but not yet anodized, can advantageously be provided for the subsequent manufacture process either as a band or on a roll or in a plate form.

Subsequent anodising of the aluminium layer 4, 4' of the prepared composite layer 2, 2', 2" is preferably realized in a tunnel machine or in an appropriate dip tank. Finally, the anodized composite layers 2, 2' are connected either to each other or to the metal layer 7 by application of the adhesive 6, 6'. Prior to or subsequently to complete curing of the adhesive layer 6, 6', the band ware and/or the plate ware is cut and then dried. The dried individual layers and/or plates which can each be formed as multi-substrate, are then masked and etched by masking and etching technologies known in the art, thereby realizing a defined structuring at least of one of the copper layers 3, 3'. Alternatively, structuring of the copper layers 3, 3', where said copper layers 3, 3' have higher layer thicknesses, can be realized by punching or cutting by means of a laser unit or a water jet unit. Following realisation of a final cleaning, the substrates 1 can be separated, i.e. preferably by using a laser unit or a mechanical separation method.

In the invention, a copper layer 3, 3', 3" is also required to include a copper alloy layer.

Figure 6:
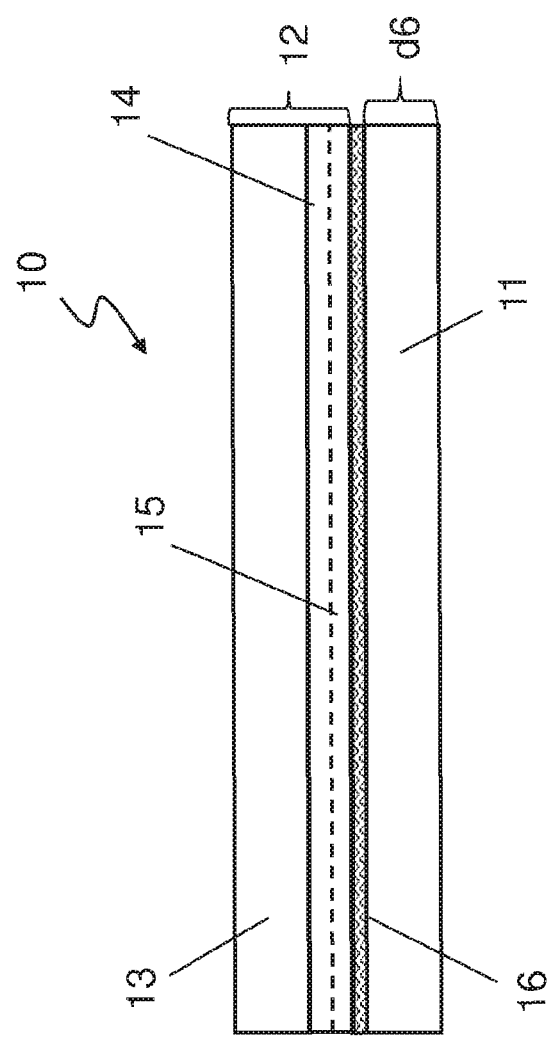
FIG. 6 shows a simplified, schematic sectional representation of a substrate according to the invention through a substrate of the invention having a paper ceramic layer.
Figure 7:
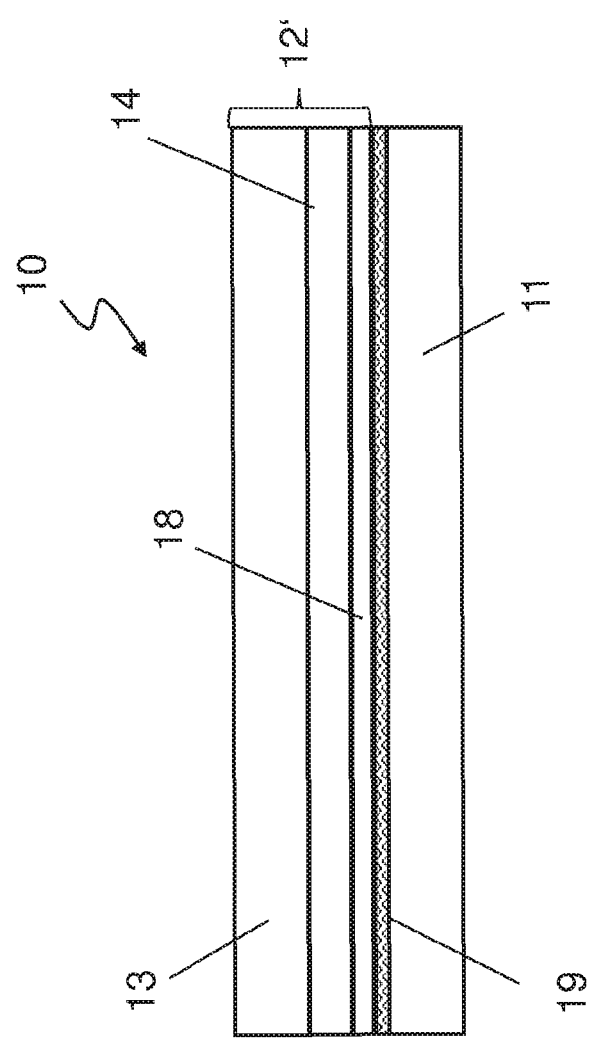
FIG. 7 shows a simplified schematic sectional representation through a substrate according to FIG. 6 having a composite layer of a distinct structure and a solder connection to the paper ceramic layer.

In an alternative embodiment of the substrates 10 of the invention according to FIGS. 6 and 7, the insulating strength of the substrate 10 is furthermore enhanced by the fact that a paper ceramic layer 11 is used instead of a metal layer 7. To this effect, the substrate 10 comprises a composite layer 12 having a metal layer 13 and at least one aluminium layer 14. The aluminium layer 14 of the composite layer 12 is also formed at least partially in an anodized form such that an anodic layer 15 is generated which, in turn, is connected to the paper ceramic layer 11 via the adhesive layer 16. Thereby, the anodic layer 15 serves in particular as an adhesive enhancer in order to replace the smooth surface of the aluminium layer 14 by the roughened anodic layer 15 which ensures a high adhesive force of the adhesive connection between the paper ceramic layer 11 and the composite layer 12.

Herein, a paper ceramic layer is meant to be a paper structure enriched during the paper production with a sinterable ceramic powder, preferably aluminium oxide powder of which a pre-ceramic paper structure is generated. Preferably, the percentage of the sinterable ceramic powder in the aggregate volume of the pre-ceramic paper structure ranges between 80 and 90% by weight.

The pre-ceramic paper structure undergoes a two-step thermal implementation process and in the first step, one generates initially a "brown compact" from the pre-ceramic paper structure ("green compact"), wherein the organic components of the pre-ceramic paper structure, such as pulp, starch and latex, are removed by oxidation. Subsequently and in a second step, the "brown compact" is delivered to a sinter process wherein a ceramic substance, namely the paper ceramic, is generated with the typical material properties of a ceramic material, such as for example a high bending and insulating strength. However, compared to a conventional ceramic layer, the paper ceramic layer 11 is lighter and shapeable on an individual basis prior to realizing the thermal implementation process. Owing to its deformability, the raw material of the paper ceramic layer 11, i.e. the pre-ceramic paper structure, can also preferably be stored and processed as roll goods. The paper ceramic layer 11 used according to the invention comprises for example a layer thickness d6 ranging between 50 µm and 600 µm, preferably between 80 µm and 150 µm and has an e-module between 90 GPa and 150 GPa.

The structure of the metal layer 13, in turn, is realized by means of masking and etching technologies known in the art, preferably following production of the adhesive connection with the paper ceramic layer 11.

In another alternative embodiment, a composite layer 12' is used, which, in addition to the copper layer 13 and the aluminium layer 14, comprises an aluminium silicium layer 18 adjoining thereto, which is also produced by roll cladding, namely preferably in a first step, a composite made of the aluminium layer 14 and an aluminium silicium layer 18 adjoining thereto is generated by roll cladding, and this composite is again roll cladded with the copper layer 13. The aluminium silicium layer 18 of the composite layer 12' is connected to the paper ceramic layer 11 via a solder layer 19. An example of a substrate 10 of an appropriate form is schematically illustrated in FIG. 7. Brazing of the paper ceramic layer 11 made of aluminium oxide is realized under protective gas, for example N2 or AR, and by profiting from the aluminium silicium eutectic.

According to the invention, existing cracks are filled when using adhesives having a low viscosity, among others, also in the insulating layers 5, 5', by heating the composite layer 2, 2' accordingly, without however achieving the curing temperature of the adhesive, in order to specifically generate cracks on the weak spots in which the adhesive can then penetrate. By the use of the appropriate process temperatures ranging from 120° C. to 160° C., existing cracks are enlarged and can therefore be simply be filled with adhesive. The temperature increase can then be realized stepwise or on a continuous basis via a defined period of time. During a stepwise temperature increase, any vaporisation of any binding agents potentially contained in the adhesive is advantageously realized. The curing temperatures of current adhesives amount herein for example to more than 180° C. In order to enhance the conductibility of the adhesives used, they can also be enriched with nanofibres, in one alternative embodiment of the invention.

The composite layers 2, 2' produced by roll cladding preferably have a significantly thinner aluminium layer 4, 4', 4" compared to the copper layers 3, 3', namely the layer thickness d2 of the aluminium layer 4, 4', 4" is less than half of the layer thickness d1 of the copper layers 3, 3', preferably even less than one third of the layer thickness d1 of the copper layers 3, 3'. In particular, complete transformation of the aluminium layer 4, 4', 4" by appropriate anodising in the insulating layer 5, 5', 5" is advantageous herein, as any contamination of the etching bath by solving of aluminium from the at least partially existing aluminium layer 4, 4', 4" is avoided. Hence, the layer thickness of the aluminium thickness 4, 4', 4" remaining following transformation into the insulating layer 5, 5', 5", is preferably kept to a minimum.

The adhesive connection between the distinct composite layers and/or layers can also be realized following application of the adhesive combined with laminating and/or rolling in order to keep the layer thickness d4 of the adhesive layer 6 to a minimum.

Moreover, vacuum can be applied to the substrate 1 in order to be able to remove potential gas impacts in the anodic layer and/or the insulating layer 5 made of aluminium oxide, which contributes to an increase and thereby to a degradation of the insulating strength. In another alternative embodiment, the respective adhesive layer 6, 6', 6" comprises at least two distinct adhesives, which are preferably applied successively and in layers. For example, one can use adhesives having distinct viscosities, wherein one adhesive having a low viscosity is provided for filling the defaults in the form of cracks and pores in the respective anodic layer 5, 5', 5" and the other adhesive having a higher viscosity is provided for producing the adhesive connection of the layer combination.

For example, said bonding can be realized by means of an epoxy adhesive and said filling of the defaults can only be realized with pure epoxy, i.e., without any curing agent fraction. Compared to said epoxy adhesive, said epoxy can advantageously be processed under higher temperatures in order to reduce its viscosity. It is also possible to remove excessive filler material, in particular epoxy such that basically epoxy remains only in the defaults. In the next step, said epoxy adhesive is then applied. The curing agent fraction of the epoxy adhesive then also diffuses into the pure epoxy already processed in the filled default spots, curing these, too.

Figure 8:
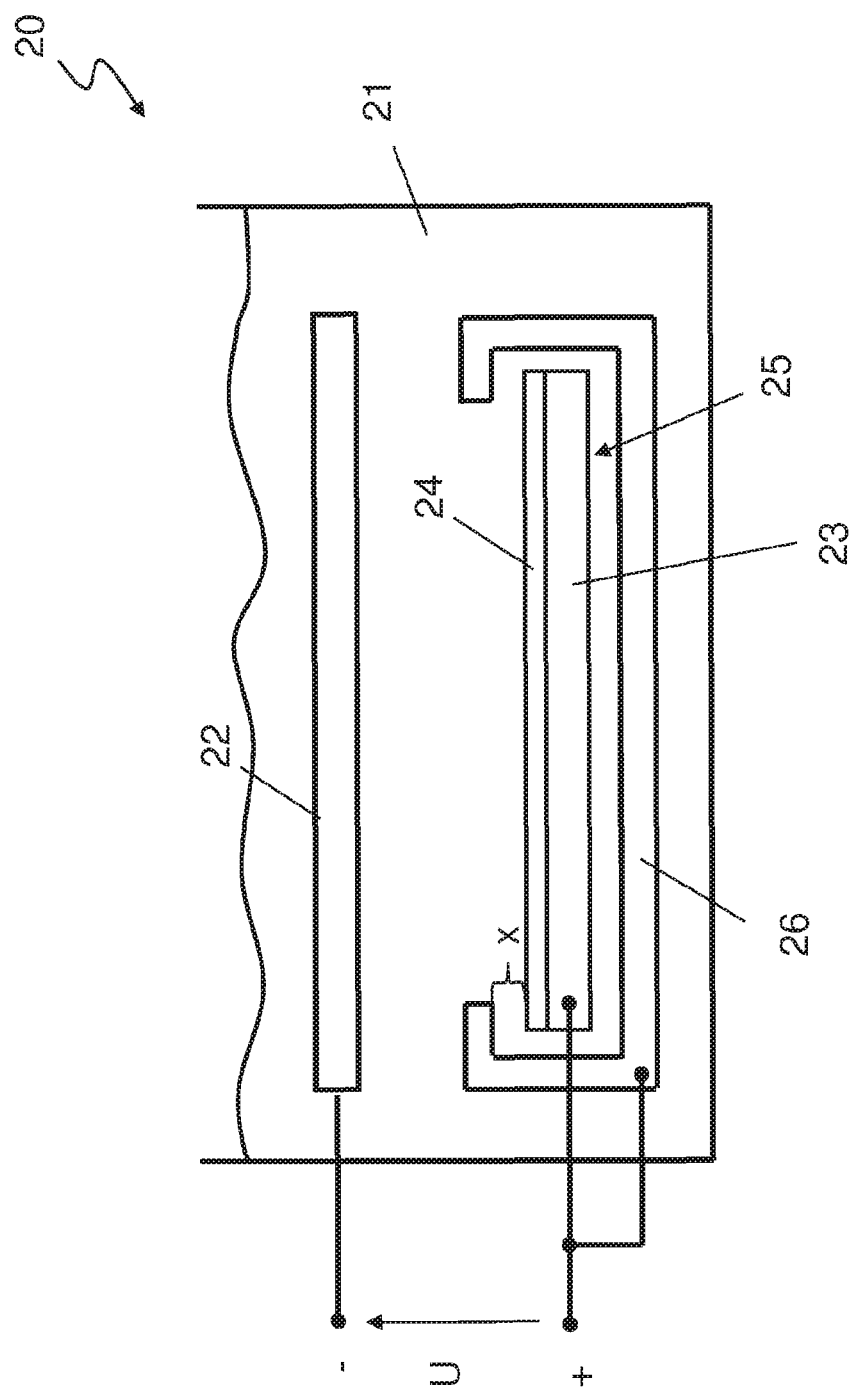
FIG. 8 shows a schematic sectional representation of an anodic bath in order to anodize the aluminium layer respectively the aluminium alloy layer in a roll cladded composite layer.

When anodizing roll cladded composite layers 25 comprising a copper layer or a copper alloy layer 23 and an aluminium layer or an aluminium alloy layer 24, it is crucial that both metals do not get in contact with the electrolyte 21 of an anodic bath 20, as otherwise a kind of short circuit parallel to the anodized surface of the aluminium layer or the aluminium alloy layer 24 is generated via the copper layer of the copper alloy layer 23. This short circuit prevents any risk of generating sufficient voltage via the thin oxide layer ($Al_2O_3$) which normally already exists prior to the anodic treatment. Said generating voltage locally punches through the thin oxide layer ($Al_2O_3$), entailing oxidation of the aluminium arranged thereunder, transforming it into aluminium oxide. FIG. 8 represents a schematic drawing of an appropriate anodic bath 20 having a cathode 22 and the anode formed by the copper layer or the copper alloy layer 23 where the direct-current voltage U is applied.

The inventors found that an occurrence of such a short circuit can be prevented by completely masking or covering the surfaces of the copper layers 23 by a frame shaped cover element, i.e. any contact of the electrolyte 21 with the copper layer 23 is efficiently prevented, whereas the contact with the aluminium layer 23 required for anodising is still maintained. In an alternative embodiment, masking can also be realized by applying a protective foil or a protective paint or a combination of these. The common point of these methods is the sealing effect with respect to the electrolyte 11.

In an alternative embodiment, masking or covering of the electrical field is realized by auxiliary electrodes 26, for example metal sheets or components which can be equipped with an appropriate coating and which are refractory against the used chemical components of the anodic bath 20 as well as the existing electrical fields. Said auxiliary electrodes 26 are electrically connected to the anode such that the direct-current voltage U and/or the generated electrical field between the auxiliary electrode 26 and the surface of the copper layer 23 of the composite layer 25 are equal to zero. Consequently, no "mechanical" sealing of the surfaces of the copper layers is necessary unless a chemical treatment of the copper layer 3 is realized. Hence, said "sealing" of the copper layer 23 is made without contact.

In an advantageous embodiment, the distance x between the framelike auxiliary electrode 25 and the aluminium layer and/or the aluminium alloy layer 24 of the composite layer 25 received therein is greater than 0 mm, but smaller than 10 mm, preferably ranging between 0 and 1 mm.

The terms "approximately", "essentially" or "for example" in the meaning of the invention mean deviations from the respective precise value by +/−10%, preferably by +/−5% and/or deviations in the form of modifications, which are insignificant to the function.

The invention was hereinabove described by means of exemplary embodiments. It is clear that a large number of changes as well as modifications is possible without however diverging from the basic inventive idea of the invention.

LIST OF REFERENCE NUMBERS

1 Substrate
2 First composite layer
2' Second composite layer
2" Third composite layer
3, 3', 3" Copper layer
4, 4', 4" Aluminium layer
5, 5', 5" Anodic layer and/or insulating layer from aluminium oxide
6, 6', 6" Adhesive layer
7 Metal layer
10 Substrate
11 Paper ceramic layer
12, 12' Composite layer
13 Metal layer, in particular copper layer
14 Aluminium layer
15 Anodic layer and/or insulating layer made of aluminium oxide
16 Adhesive layer
18 Aluminium silicium layer
19 Solder layer
20 Anodic bath
21 Electrolyte
22 Cathode
23 Copper layer and/or copper alloy layer
24 Aluminium layer and/or aluminium alloy layer
25 Composite layer
26 Auxiliary electrode
p Profiling
d1-d6 Layer thicknesses
U Direct-current voltage
X Distance

The invention claimed is:
1. A substrate for electrical circuits, comprising at least a first composite layer produced by roll cladding and which, following roll cladding, comprises at least one copper layer and an aluminium layer adjoining thereto, wherein at least the surface side of the aluminium layer facing away from the copper side is anodized for producing an anodic and/or an insulating layer made of aluminium oxide and wherein the anodic and/or the insulating layer made of aluminium oxide is connected via at least one adhesive layer to at least a second composite layer;

characterized in that the adhesive layer comprises an epoxy resin adhesive, acrylic adhesive or polyurethane adhesive and/or that the adhesive used for producing the adhesive layer is capable of penetrating into and filling cracks in the surface of the anodic and/or the insulating layer;

wherein the second composite layer is produced by roll cladding and which, following roll cladding, comprises at least one additional copper layer and an additional aluminium layer adjoining thereto, wherein at least the additional surface side of the additional aluminium layer facing away from the additional copper side is anodized for producing an additional anodic and/or an additional insulating layer made of aluminium oxide and wherein the additional anodic and/or additional insulating layer made of additional aluminium oxide is connected via at least one additional adhesive layer to an additional metal layer or at least a third composite layer or at least an additional paper ceramic layer.

2. The substrate according to claim 1, characterized in that the first and the second composite layer are connected via at least one additional intermediate layer by means of one adhesive layer each.

3. The substrate according to claim 2, characterized in that the intermediate layer is formed by an aluminium layer which is anodized on its respective opposite surface sides in order to generate two opposing anodic and/or insulating layers made of aluminium oxide.

4. The substrate according to claim 3, characterized in that the intermediate layer is formed by a third composite layer comprising an aluminium layer, a copper layer, and an additional aluminium layer, wherein the respective surface sides of the aluminium layers facing away from the copper layer are anodized in order to generate two opposite anodic and/or insulating layers made of aluminium oxide.

5. The substrate according to claim 3, characterized in that the anodic and/or the insulating layers made of aluminium oxide of the first composite layer are connected via an adhesive layer to the one anodic and/or insulating layers made of aluminium oxide of the intermediate layer and the anodic and/or the insulating layers made of aluminium oxide of the second composite layer are connected via an additional adhesive layer to the other anodic and/or insulating layers made of aluminium oxide of the intermediate layer.

6. The substrate according to claim 1, characterized in that the aluminium oxide has a thickness that ranges between 5 µm and 50 µm.

7. The substrate according to claim 1, characterized in that the copper layer comprises a layer thickness ranging between 35 µm and 2 mm, the aluminium layer comprises a layer thickness ranging between 10 µm and 300 µm.

8. The substrate according to claim 1, characterized in that the at least one aluminium layer comprises a profiling introduced prior to the realisation of the anodic process.

9. The substrate according to claim 1, characterized in that the first and the second composite layer are produced by roll cladding of a copper foil with at least one aluminium foil.

10. A method for producing the substrate of claim 1 for electrical circuits, wherein at least one first composite layer is produced from a copper foil and at least one aluminium foil by means of roll cladding, comprising at least one copper layer and one adjoining aluminium layer, wherein at least the surface side of the aluminium layer facing away from the copper layer is anodized and thereby generating an anodic and/or insulating layer made of aluminium oxide, and wherein the generated anodic and/or the insulating layer made of aluminium oxide is adhered via at least one adhesive layer the second composite layer;

characterized in that the adhesive layer comprises an epoxy resin adhesive, acrylic adhesive or polyurethane adhesive and/or that the adhesive used for producing the adhesive layer is capable of penetrating into and filling cracks in the surface of the anodic and/or the insulating layer.

11. The substrate according to claim 8, characterized in that the at least one aluminium layer and comprises a plurality of pyramidal or prism-shaped recesses.

12. The substrate according to claim 1, characterized in that at least one of the copper layer of the first composite layer is structured into metalized portions to form a circuit board, a contact and/or a connecting surface.

13. The substrate according to claim 1, characterized in that the adhesive layer comprises an epoxy resin adhesive, acrylic adhesive or polyurethane adhesive.

14. A substrate for electrical circuits, comprising at least a first composite layer produced by roll cladding and which, following roll cladding, comprises at least one copper layer and an aluminium layer adjoining thereto, wherein at least the surface side of the aluminium layer facing away from the copper side is anodized for producing an anodic and/or an insulating layer made of aluminium oxide and wherein the anodic and/or the insulating layer made of aluminium oxide is connected via at least one adhesive layer to at least a paper ceramic layer;

characterized in that the adhesive layer comprises an epoxy resin adhesive, acrylic adhesive or polyurethane adhesive and/or that the adhesive used for producing the adhesive layer is capable of penetrating into and filling cracks in the surface of the anodic and/or the insulating layer.

* * * * *